(12) United States Patent
Brusic et al.

(10) Patent No.: US 8,062,096 B2
(45) Date of Patent: Nov. 22, 2011

(54) USE OF CMP FOR ALUMINUM MIRROR AND SOLAR CELL FABRICATION

(75) Inventors: Vlasta Brusic, Geneva, IL (US); Richard Jon Jenkins, Warrenville, IL (US); Christopher C. Thompson, Earlville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 1221 days.

(21) Appl. No.: 11/173,518

(22) Filed: Jun. 30, 2005

(65) Prior Publication Data

US 2007/0010098 A1 Jan. 11, 2007

(51) Int. Cl.
*B24B 1/00* (2006.01)

(52) U.S. Cl. ........... 451/41; 451/37; 451/57; 451/60; 451/79; 451/81; 451/92; 451/142; 451/297; 451/526; 451/534

(58) Field of Classification Search .......... 451/41, 451/37, 57, 60, 79, 81, 92, 142, 297, 526, 451/534, 539
See application file for complete search history.

(56) References Cited

U.S. PATENT DOCUMENTS

| 3,662,501 | A | * | 5/1972 | Mendel ............... 451/37 |
| 4,769,046 | A | | 9/1988 | Senda et al. |
| 4,835,909 | A | | 6/1989 | Richter et al. |
| 4,839,005 | A | | 6/1989 | Katsumoto et al. |
| 4,959,113 | A | | 9/1990 | Roberts |
| 5,196,353 | A | | 3/1993 | Sandhu et al. |
| 5,209,816 | A | | 5/1993 | Yu et al. |
| 5,230,833 | A | | 7/1993 | Romberger et al. |
| 5,433,651 | A | | 7/1995 | Lustig et al. |
| 5,609,511 | A | | 3/1997 | Moriyama et al. |
| 5,643,046 | A | | 7/1997 | Katakabe et al. |
| 5,658,183 | A | | 8/1997 | Sandhu et al. |
| 5,730,642 | A | | 3/1998 | Sandhu et al. |
| 5,783,489 | A | | 7/1998 | Kaufman et al. |
| 5,838,447 | A | | 11/1998 | Hiyama et al. |
| 5,858,813 | A | | 1/1999 | Scherber et al. |
| 5,863,838 | A | | 1/1999 | Farkas et al. |
| 5,872,633 | A | | 2/1999 | Holzapfel et al. |
| 5,893,796 | A | | 4/1999 | Birang et al. |
| 5,897,426 | A | | 4/1999 | Somekh |
| 5,949,927 | A | | 9/1999 | Tang |
| 5,964,643 | A | | 10/1999 | Birang et al. |
| 6,033,596 | A | | 3/2000 | Kaufman et al. |
| 6,039,891 | A | | 3/2000 | Kaufman et al. |
| 6,099,389 | A | | 8/2000 | Nichols et al. |
| 6,287,175 | B1 | | 9/2001 | Marukawa et al. |
| 6,300,249 | B1 | * | 10/2001 | Yoshida et al. ............ 438/693 |
| 6,316,366 | B1 | | 11/2001 | Kaufman et al. |
| 6,350,176 | B1 | * | 2/2002 | Lyons et al. ................ 451/41 |
| 6,461,227 | B1 | | 10/2002 | Fang |
| 6,554,878 | B1 | | 4/2003 | Dill, Jr. et al. |
| 6,596,150 | B2 | | 7/2003 | Nishino et al. |
| 6,720,265 | B2 | | 4/2004 | Chopra |
| 6,830,350 | B2 | | 12/2004 | Thuli et al. |
| 6,896,591 | B2 | * | 5/2005 | Chaneyalew et al. ........ 451/41 |
| 2003/0082998 | A1 | * | 5/2003 | Carter et al. ................ 451/41 |
| 2003/0124959 | A1 | * | 7/2003 | Schroeder et al. .......... 451/41 |
| 2003/0220061 | A1 | * | 11/2003 | Prasad ....................... 451/526 |
| 2004/0165296 | A1 | * | 8/2004 | Schaefer .................... 359/883 |
| 2005/0159085 | A1 | * | 7/2005 | Scott ........................... 451/41 |

OTHER PUBLICATIONS

Fang et al., *Journal of the Electrochemical Society*, 151(12): G878-G881 (2004).
Ganguly et al., *Journal of the Electrochemical Society*, 151(11): H232-H238 (2004).
Kuo et al., *Materials Chemistry and Physics*, 69: 53-61 (2001).

* cited by examiner

*Primary Examiner* — Robert Scruggs
(74) *Attorney, Agent, or Firm* — Thomas E. Omholt; Francis J. Koszyk; Steven D. Weseman

(57) ABSTRACT

The invention is directed to a method of polishing a surface of a substrate comprising aluminum, comprising contacting a surface of the substrate with a polishing pad and a polishing composition comprising an abrasive, an agent that oxidizes aluminum, and a liquid carrier, and abrading at least a portion of the surface to remove at least some aluminum from the substrate and to polish the surface of the substrate, wherein the abrasive is in particulate form and is suspended in the liquid carrier.

42 Claims, No Drawings

USE OF CMP FOR ALUMINUM MIRROR AND SOLAR CELL FABRICATION

FIELD OF THE INVENTION

This invention pertains to a method of polishing a surface of a substrate comprising aluminum.

BACKGROUND OF THE INVENTION

Metallic mirrors have numerous applications in the field of optics. Typically, mirror surfaces are formed by applying a metallic coating to a substrate composed of another metal or of another material such as glass. When subjected to temperature variations, such as in various space and military applications, differential rates of expansion and of contraction of the mirror components lead to dimensional instability of the mirror surface. One solution has been to polish the surface of substrates composed of a single metal or metal alloy, which obviates problems caused by differences in thermal properties, and provides the substrate with the mechanical strength and rigidity of metals. Aluminum is a preferred metal due to its lightness, low cost, and compatibility with conventional surface forming processes. The performance of such mirrors in optics applications depends strongly on the surface needing to be highly uniform to minimize light scattering caused by surface irregularities.

Surface roughness parameters relevant to optical performance include not only average surface roughness ($R_a$) or root mean square surface roughness ($R_q$), but also importantly parameters including $R_{max}$ and/or $R_z$. $R_{max}$ is the largest peak-to-valley height in a given sampling region wherein the peak represents a high spot on the surface and the valley represents the depth of a scratch on the surface. $R_z$ is an average value for $R_{max}$ measured in several distinct sampling regions. Not only must average surface roughness be low for good optical performance, but also $R_z$, $R_{max}$ or related parameters must be low to minimize light scattering.

Existing methods for mirror fabrication attempt to remedy the drawbacks resulting from imperfectly formed metal surfaces by electroplating a layer of electroless nickel onto the mirror substrate and then using optical techniques to polish the second metal layer to provide surfaces exhibiting reduced light scattering. However, because again such mirrors consist of different metals, bimetallic stresses at temperatures differing from room temperature compromise mechanical and optical stability of the mirrors. Further, fabrication of the second metal layer adds significant complexity and expense to the manufacturing process.

Highly polished aluminum surfaces have additional applications in the field of solar cell fabrication. Mirror arrays are frequently used to concentrate solar radiation onto photovoltaic solar cells to improve conversion efficiency. Since diffraction of light by surface irregularities on the mirror surfaces results in lowered efficiencies in conversion of incident solar radiation to electric power, improved methods for economically producing highly reflective surfaces composed of aluminum can facilitate development of solar cell technology.

Two methods are commonly used to polish aluminum surfaces. In the field of optics, single-point diamond turning has been used for many years to produce aluminum mirrors useful for reflecting infrared (e.g., long wavelength) light. In single-point diamond turning, an aluminum substrate is rotated while in contact with a precisely positioned diamond cutting tool. The diamond cutting tool "peels" a very thin layer of aluminum from the surface of the substrate to form a surface having a precisely defined geometry. However, the diamond cutting tool produces microscopic grooves which compromise optical performance due to light scattering, particularly at shorter wavelengths. Further, single-point diamond turning is an expensive and highly time-consuming process suitable only for low volume production of specialized optical components.

The most commonly used process for polishing aluminum substrates is lapping. In lapping, a slurry of abrasive particles, typically aluminum oxide or silicon carbide in a carrier of water or an oil, is used to polish an aluminum surface by moving a polishing surface known as a lapp relative to the aluminum surface with the abrasive slurry therebetween, to abrade the surface by mechanical action of the abrasive. However, lapping generates shavings of aluminum which tend to produce microscratches on the polished surface, leading to unacceptable surface defectivity for optical applications.

Chemical-mechanical polishing or planarization (CMP) has long been used in the electronics industry to polish or planarize the surface of memory or rigid disks. Typically, memory or rigid disks comprise an aluminum substrate coated with a first layer of nickel-phosphorus. The nickel-phosphorus layer is frequently planarized by a CMP process to reduce surface waviness and roughness prior to coating with a magnetic layer, such as cobalt-phosphorus. The nickel-phosphorus layer has a highly homogeneous microstructure and a particular chemistry which differs considerably from aluminum and aluminum alloys, which have a different surface chemistry than nickel-phosphorus and an inhomogeneous microstructure comprising crystallites dispersed throughout a matrix. Further, CMP produces microscratches and leaves imbedded abrasive particles on the substrate surface, which defects cannot be tolerated in optical applications.

Thus, there remains a need for efficient and economical methods of polishing aluminum surfaces to exacting standards of surface roughness suitable for diffraction-free reflectance of light in the visible and ultraviolet ranges. The invention provides such a method. These and other advantages of the invention, as well as additional inventive features, will be apparent from the description of the invention provided herein.

BRIEF SUMMARY OF THE INVENTION

The invention provides a method of polishing a surface of a substrate comprising aluminum, which method comprises (i) providing a substrate comprising aluminum, (ii) providing a polishing pad, (iii) providing a polishing composition comprising (a) an abrasive selected from the group consisting of silica, ceria, and zirconia, (b) an agent that oxidizes aluminum, and (c) a liquid carrier, wherein the abrasive is in particulate form and is suspended in the liquid carrier, (iv) contacting a surface of the substrate with the polishing pad and the polishing composition, and (v) abrading at least a portion of the surface of the substrate to remove at least some aluminum from the substrate and to polish the surface of the substrate.

The invention further provides a method of polishing a surface of a substrate comprising aluminum, which method comprises (i) providing a substrate comprising aluminum, (ii) providing a polishing pad comprising (A) a resilient subpad and (B) a polymeric polishing film substantially coextensive with the resilient subpad, wherein the polymeric polishing film comprises a polishing surface and a back surface releasably associated with the resilient subpad, (iii) providing a polishing composition comprising (a) an abrasive selected from the group consisting of silica, ceria, and zirconia, (b) an agent that oxidizes aluminum, and (c) a liquid carrier, wherein the abrasive is in particulate form and is suspended in the liquid carrier, (iv) contacting a surface of the substrate with the polishing surface of the polishing pad and the polishing composition, and (v) abrading at least a portion of the surface of the substrate to remove at least some aluminum from the substrate and to polish the surface of the substrate.

DETAILED DESCRIPTION OF THE INVENTION

The invention provides a method of polishing a surface of a substrate comprising aluminum. The method comprises (i) providing a substrate comprising aluminum, (ii) providing a polishing pad, (iii) providing a polishing composition, (iv) contacting a surface of the substrate with the polishing pad and the polishing composition, and (v) abrading at least a portion of the surface of the substrate to remove at least some aluminum from the substrate and to polish the surface of the substrate. The polishing composition comprises (a) an abrasive selected from the group consisting of silica, ceria, and zirconia, (b) an agent that oxidizes aluminum, and (c) a liquid carrier, wherein the abrasive is in particulate form and is suspended in the liquid carrier.

The substrate comprises aluminum. The substrate can comprise pure aluminum or an aluminum alloy. Numerous aluminum alloys are commercially available which are individually characterized by the presence of various elements in addition to aluminum and by the particular processes used in their production. Aluminum alloys are further subdivided into foundry alloys and wrought alloys, wherein foundry alloys are intended for use in molding processes employing the molten alloys, and wrought alloys are intended for use in mechanical shaping processes of the solid alloys. Wrought alloys are often further heat-treated to modify mechanical properties (e.g., hardness) of the alloys. Any aluminum alloy is suitable for use in the inventive method. Preferably, the substrate comprises an aluminum alloy of the 6000 series, wherein the term "6000 series" refers to the Aluminum Association designation of a particular group of aluminum alloys. More preferably, the aluminum alloy is 6061 T6 aluminum alloy, which additionally comprises minor amounts of silicon, iron, copper, manganese, magnesium, chromium, zinc, and titanium.

The polishing pad (e.g., polishing surface) can be any suitable polishing pad, many of which are known in the art. The polishing pad can be a conventional one-piece polishing pad, wherein a surface of the polishing pad makes contact with the surface of the substrate being polished. Suitable polishing pads include, for example, woven and non-woven polishing pads. Moreover, suitable polishing pads can comprise any suitable polymer of varying density, hardness, thickness, compressibility, ability to rebound upon compression, and compression modulus. Preferably, the polishing pad consists of a polymer resin selected from the group consisting of thermoplastic elastomers, thermoplastic polyurethanes, thermoplastic polyolefins, polycarbonates, polyvinyl alcohols, nylons, elastomeric rubbers, elastomeric polyethylenes, polytetrafluoroethylene; polyethyleneteraphthalate, polyimides, polyaramides, polyarylenes, polystyrenes, polymethylmethacrylates, copolymers thereof, and mixtures thereof. More preferably, the polishing pad consists of thermoplastic polyurethane.

The choice of any particular polishing pad will depend in part upon the specific application in which it is used. For example, polishing a surface having a curvature may require the use of a polishing pad with a lower hardness rating than might be suitable for polishing a more planar surface.

In one embodiment, the polishing pad comprises a resilient subpad and a polymeric polishing film substantially coextensive with the resilient subpad, wherein the polymeric polishing film comprises a polishing surface and a back surface releasably associated with the resilient subpad. The term "film" as used herein with respect to the polishing film refers to material with a thickness of about 0.5 mm or less. The polishing film is considered to be "releasably associated" with the resilient subpad if it is associated in a manner such that the removal of the polishing film from the resilient subpad does not significantly alter any portion of the surface of the subpad that lies directly beneath a portion of the polishing surface used during polishing. The polymeric polishing film can be releasably associated with the resilient subpad with or without the use of an adhesive compound. The term "adhesive" as used herein refers to any of the commonly known class of adhesive materials such as glues, epoxies, hot-melt adhesives, pressure sensitive adhesives, and the like. For example, the back surface of the polymeric polishing film can be releasably associated with the resilient subpad by placing the polymeric polishing film on the resilient subpad, wherein there is no intervening layer (e.g., no adhesive layer) between the back surface of the polymeric polishing film and the surface of the resilient subpad. The polymeric polishing film is held in place on the resilient subpad, for example, by friction or electrostatic interaction. Alternatively, a vacuum can be applied through the resilient subpad to hold the polymeric polishing film to the surface of the resilient subpad. The vacuum can be applied through pores in the resilient subpad (e.g., by using a porous subpad) or through channels formed in the resilient subpad. Other methods of releasably associating the back surface of the polymeric polishing film with the resilient subpad will be readily apparent to the skilled artisan.

The polishing pad can further comprise an adhesive compound positioned between the back surface of the polymeric polishing film and the resilient subpad, provided the adhesive desirably is positioned only on one or more areas of the subpad that are disposed beneath one or more areas of the polishing surface that are not used during polishing. For example, the adhesive compound can be positioned on the center portion of the resilient subpad for applications in which the substrate contacts the polishing pad only on the areas peripheral to the center of the polishing pad during polishing. Similarly, the adhesive can be positioned on the peripheral portions of the resilient subpad for applications in which only the central portion of the polishing pad contacts the substrate during polishing. Preferred adhesives are those that facilitate easy removal of the polymeric polishing film from the resilient subpad, such as known light-tack adhesives and double-sided adhesive tapes.

The polymeric polishing film can have any suitable hardness. Generally, the polymeric polishing film will have a hardness such that the film substantially conforms to any global topology present on the surface of the substrate comprising aluminum, but does not substantially conform to local defects in the global topology (e.g., depressions or protrusions that otherwise disrupt a continuous topology). Preferably, the polymeric polishing film comprises a material selected from the group consisting of polycarbonate, polyester, nylon, polyvinyl chloride, and combinations thereof.

Any suitable subpad can be used in conjunction with the invention. The choice of any particular subpad will depend in part upon the specific application in which it is used (e.g., for polishing of planar or curved surfaces). Suitable subpad materials include one or more of any of the polymers previously identified with respect to the polishing pad. Typically, the subpad consists of thermoplastic polyurethane.

The resilient subpad can have any suitable thickness. Typically, the resilient subpad has a thickness of about 0.1 mm or more, such as about 0.5 mm or more, or even about 0.8 mm or more (e.g., about 1 mm or more). Thicker resilient subpads can also be used, such as subpads having a thickness of about 2 mm or more, such as about 4 mm or more, or even 6 mm or more (e.g., about 8 mm or more).

The polishing pad can be configured for use in conjunction with end-point detection techniques by providing a pathway in the pad through which electromagnetic radiation (e.g., visible or infrared light) can travel. For example, a portion of the subpad can be removed to provide an aperture in the subpad for the passage of light to the polymeric polishing film, or a portion of the subpad can be replaced with a material that is transparent or translucent to light to provide a window in the subpad. Alternatively, the entire subpad can be made from a material that is translucent or transparent to light. Similarly, the polymeric polishing film can be made from a material that is translucent or transparent to light in one or more areas corresponding to the window or aperture in the subpad, or the entire polymeric polishing film can be made from a material that is translucent or transparent to light. Techniques for inspecting and monitoring the polishing process by analyzing light or other radiation reflected from a surface of a substrate being polished are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a substrate being polished enables the determination of the polishing end-point, i.e., the determination of when to terminate the polishing process with respect to a particular substrate.

Although the polishing pad has been described herein with respect to the polymeric polishing film and the resilient subpad, the polishing pad can be used in conjunction with additional layers (e.g., additional subpads, backing layers, etc.) without departing from the scope of the invention. Furthermore, the polishing pad can have any suitable dimensions. The polishing pad desirably is a disc shape (as is used in rotary polishing tools), but can be produced as a looped linear belt (as is used in linear polishing tools) or have a rectangular shape (as is used in oscillating polishing tools).

The polishing composition is a chemical-mechanical polishing composition. The polishing composition comprises an abrasive selected from the group consisting of fumed silica; precipitated silica, condensation polymerized silica, ceria, and zirconia, wherein the abrasive is in particulate form and is suspended in the liquid carrier. Fumed metal oxides, e.g., fumed silica, fumed ceria, and fumed zirconia, can be prepared from any suitable volatile or nonvolatile precursor. Fumed metal oxides can be produced from volatile precursors by hydrolysis and/or oxidation of the precursors (e.g., metal chloride) in a high temperature flame ($H_2$/air or $H_2$/$CH_4$/air) to produce the metal oxide of interest. Fumed metal oxides can be prepared from nonvolatile precursors by dissolving or dispersing the precursor in a suitable solvent such as water, alcohol, or acid-based solvent. The solution containing the precursor can be sprayed into a high temperature flame using a droplet generator, and the metal oxide aggregate then can be collected. Typical droplet generators include bi-fluid atomizers, high pressure spray nozzles, and ultrasonic atomizers.

Suitable colloidal silica in the context of the invention includes wet-process type silica particles (e.g., condensation-polymerized silica particles) and precipitated silica. Condensation-polymerized silica particles typically are prepared by condensing $Si(OH)_4$ to form colloidal particles, where colloidal is defined as particles having an average particle size between about 1 nm to about 1000 nm (e.g., about 5 nm to about 800 nm, such as about 10 nm to about 500 nm, or about 20 nm to about 300 nm). Such abrasive particles can be prepared in accordance with U.S. Pat. No. 5,230,833 or can be obtained as any of various commercially available products, such as the Akzo-Nobel Bindzil 50/80 product and the Nalco 1050, 2327, and 2329 products, as well as other similar products available from DuPont, Bayer, Applied Research, Nissan Chemical, and Clariant.

Precipitated silica (precipitated silicon dioxide) is prepared by reacting an alkaline silicate solution, such as sodium silicate (waterglass) with a mineral acid, such as sulfuric acid. Silica is the major reaction product formed by precipitation. The silica thus produced is filtered, washed, dried, and separated from residues of other reaction products, all of which are standard techniques well known to those skilled in the art.

Ceria and zirconia useful in the inventive method can be prepared by a fuming process, a precipitation process, or a hydrothermal process. In a hydrothermal process, a metal salt (e.g., a metal nitrate) having the same oxidation level as the desired metal oxide is dissolved in water, treated with a base (e.g., ammonium hydroxide), and subjected to conditions of elevated temperature and pressure. The hydrothermal process results in the conversion of the metal salt into the corresponding metal oxide.

The abrasive particles desirably have an average particle size (typically, average diameter of the smallest spheres encompassing the particles) of at least about 10 nm or more (e.g., about 25 nm or more, or about 100 nm or more). Preferably, the abrasive particles have an average particle size of about 1000 nm or less (e.g., about 800 nm or less, or about 500 nm or less, or even about 300 nm or less). Of course, any of the above amounts expressed in terms of optional upper and lower limits also can be expressed as ranges (e.g., about 10 nm to about 1000 nm, or about 25 nm to about 800 nm, or about 100 nm to about 500 nm).

Some abrasive particles, such as fumed metal oxide abrasive particles, comprise small primary particles that are fused together to form larger, chain-like aggregate particles. Considerable force is required to break these aggregate particles into primary particles. For example, the aggregate particles do not break down under normal dispersion forces. This differentiates aggregate particles from agglomerate particles, which are formed by the relatively loose association of aggregate particles with one another. When the abrasive particles are provided by aggregate particles, such as fumed metal oxide particles, the particle size referred to herein relates to the size of the aggregate particle, not the size of the primary particles that are fused together to make up the aggregate. Thus, the average particle size of a fumed metal oxide particle, for example, is the average diameter of the smallest spheres encompassing the aggregate particles.

The abrasive can be present in the polishing composition in any suitable amount. The amount of abrasive present in the polishing composition typically is about 0.1 wt. % or more (e.g., about 0.25 wt. % or more, or about 0.5 wt. % or more, or about 1 wt. % or more) based on the total weight of the polishing composition. The amount of abrasive present in the polishing composition preferably is about 20 wt. % or less (e.g., about 15 wt. % or less, or about 10 wt. % or less) based on the total weight of the polishing composition. More preferably, the amount of abrasive present in the polishing composition is about 1 wt. % to about 10 wt. % based on the total weight of the polishing composition. Any of the above amounts expressed in terms of optional upper and lower limits also can be expressed as ranges (e.g., about 0.1 wt. % to about 20 wt. %, or about 0.25 wt. % to about 15 wt. %, or about 0.5 wt. % to about 10 wt. %).

The abrasive desirably is suspended in the polishing composition, more specifically in the liquid carrier of the polishing composition. When the abrasive is suspended in the polishing composition, the abrasive preferably is colloidally stable. The term colloid refers to the suspension of abrasive particles in the liquid carrier. Colloidal stability refers to the maintenance of that suspension over time. In the context of this invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., $\{[B]-[T]\}/[C] \leq 0.5$). The value of $[B]-[T]/[C]$ desirably is less than or equal to 0.3, and preferably is less than or equal to 0.1.

The agent that oxidizes aluminum can be any suitable agent that oxidizes aluminum. Preferably, the agent that oxidizes aluminum is selected from the group consisting of ammonium persulfate, hydrogen peroxide, potassium hydrogen peroxymonosulfate sulfate, and peracetic acid.

The polishing composition can comprise any suitable amount of the agent that oxidizes aluminum. Typically, the polishing composition comprises about 0.01 wt. % to about 10 wt. % (e.g., about 0.05 wt. % to about 5 wt. %, or about 0.1 wt. % to about 2 wt. %) of the agent that oxidizes aluminum, based on the total weight of the polishing composition.

The polishing composition optionally comprises an organic acid. Organic acids useful in the polishing composition include monocarboxylic and dicarboxylic acids and their salts. Preferably, the organic acid is selected from the group consisting of acetic acid, propionic acid, butyric acid, benzoic acid, formic acid, malonic acid, succinic acid, oxalic acid, lactic acid, tartaric acid, amino acid, derivatives thereof, salts thereof, and combinations thereof. More preferably, the organic acid is succinic acid.

The polishing composition can comprise any suitable amount of the organic acid and when present typically comprises about 10 ppm or more (e.g., about 10 to about 1000 ppm). Preferably, the amount of organic acid present in the polishing composition will be about 1000 ppm or less (e.g., about 800 ppm or less, or about 600 ppm or less).

It will be appreciated that the aforementioned organic acids can exist in the form of a salt (e.g., a metal salt, an ammonium salt, or the like), an acid, or as a partial salt thereof. For example, succinates include succinic acid, as well as mono- and di-salts thereof. Furthermore, organic acids including basic functional groups can exist in the form of an acid salt of the basic functional group. For example, glycines include glycine, as well as monoacid salts thereof.

The polishing composition can have any suitable pH. Typically, the polishing composition will have a pH of about 12 or less (e.g., about 11 or less, or about 10 or less). Preferably, the polishing composition will have a pH of about 1 or more (e.g., about 2 or more, or about 3 or more). More preferably, the polishing composition will have a pH of about 3 to about 10.

The pH of the polishing composition can be achieved and/or maintained by any suitable means. More specifically, the polishing composition can further comprise a pH adjustor, a pH buffering agent, or a combination thereof. The pH adjustor can be any suitable pH-adjusting compound. For example, the pH adjustor can be nitric acid, potassium hydroxide, sodium hydroxide, ammonium hydroxide, or a combination thereof. The pH buffering agent can be any suitable buffering agent, for example, phosphates, acetates, borates, ammonium salts, and the like. The chemical-mechanical polishing composition can comprise any suitable amount of a pH adjustor and/or a pH buffering agent, provided such amount is sufficient to achieve and/or maintain the pH of the polishing system within the ranges set forth herein.

The polishing composition optionally further comprises one or more other additives. Such additives include any suitable surfactant and/or rheological control agent, including viscosity enhancing agents and coagulants (e.g., polymeric rheological control agents, such as, for example, urethane polymers), acrylates comprising one or more acrylic subunits (e.g., vinyl acrylates and styrene acrylates), and polymers, copolymers, and oligomers thereof, and salts thereof. Suitable surfactants include, for example, cationic surfactants, anionic surfactants, anionic polyelectrolytes, nonionic surfactants, amphoteric surfactants, fluorinated surfactants, mixtures thereof, and the like.

The polishing composition optionally further comprises an antifoaming agent. The anti-foaming agent can be any suitable anti-foaming agent. Suitable antifoaming agents include, but are not limited to, silicon-based and acetylenic diol-based antifoaming agents. The amount of anti-foaming agent present in the polishing composition typically is about 40 ppm to about 140 ppm.

The polishing composition optionally further comprises a biocide. The biocide can be any suitable biocide, for example an isothiazolinone biocide. The amount of biocide used in the polishing composition typically is about 1 ppm to about 500 ppm, and preferably is about 10 ppm to about 200 ppm.

The polishing composition can be prepared in any suitable manner. Generally, the polishing composition can be prepared by combining and mixing the components thereof in a batch or continuous process. Furthermore, the polishing composition can be prepared in-whole or in-part prior to use, or each of the individual components of the polishing composition can be separately stored and combined immediately prior to or during use. When the polishing composition is prepared in-part prior to use, one or more components of the polishing composition, such as an agent that oxidizes aluminum, can be added to the polishing composition just before or during use (e.g., within about 1 minute before use, or within about 1 hour before use, or within about 7 days before use). When all or some of the components of the polishing composition are separately stored and combined during use, the components can be delivered to the surface of the substrate being polished, where the components are combined and mixed to provide the polishing composition. The pH of the polishing composition or any one or more of its components can be adjusted at any suitable time.

The surface of the substrate can have any curvature. The surface of the substrate can have substantially no curvature (e.g., the surface of the substrate can be substantially planar), or the surface can have a curvature (e.g., the surface of the substrate can be convex or concave). Surface curvature can be produced by a number of methods, all of which are well known in the art.

The surface of the substrate comprising aluminum can be as-formed by any suitable process used to produce the substrate. The surface of the substrate can be formed by a mechanical working process (e.g., rolling, extrusion, and forging) or the surface of the substrate can be produced by a casting process (e.g., sand casting, permanent mold casting, and die casting).

Alternatively, the surface of the substrate comprising aluminum can be pre-polished prior to contacting the surface of the substrate with the polishing pad and the polishing composition in accordance with the invention. The surface of the substrate can be pre-polished, for example, by diamond turning. In diamond turning, a substrate is rotated while being contacted with a diamond cutting tool under precisely controlled conditions to remove material from the surface of the substrate by cutting microscopic slivers from the surface of the substrate, thereby resulting in the production of a highly regular surface.

The surface of the substrate comprising aluminum can be pre-polished by lapping. In lapping, a surface of a substrate is abraded by moving the substrate surface relative to a lapping surface with a particulate abrasive (e.g., alumina or silicon carbide) present between the substrate surface and the lapsing surface. The particulate abrasive is typically suspended in a liquid carrier such as water or oil. Lapping can be performed with a circular, linear, or oscillating motion. Generally, the lapping surface comprises a hard material such as cast iron or brass. In the context of the invention, lapping generally refers to any suitable technique resulting in dimensional changes principally limited to the removal of high spots on the substrate surface, including but not limited to superfinishing, buffing, honing, and the like.

The inventive method can be used to polish a surface of a substrate comprising aluminum to provide a polished surface having a predetermined surface roughness. Numerous measures of surface roughness are known in the art. For example, the surface roughness can be measured mechanically by moving a stylus along a surface or by using light scattering techniques. The American Society of Mechanical Engineers (ASME) standard B46.1-2002 contains descriptions of methods used to measure and express surface roughness. Thus, depending on the particular surface roughness desired for a substrate, the inventive polishing method can be conducted for a duration sufficient to produce the desired surface roughness. The polishing operation can be interrupted, and the surface roughness determined. If the predetermined surface roughness has not been achieved, polishing can be continued, until measurement indicates that the desired surface roughness has been achieved. Alternatively, end-point detection techniques as described above can be used to measure surface roughness in situ during polishing to allow for in-process monitoring of surface roughness.

The surface of the substrate comprising aluminum can be polished by any suitable technique. In a preferred method, the surface typically will be pressed against a polishing pad in the presence of the polishing composition under controlled chemical, pressure, velocity, and temperature conditions. A preferred method of polishing a surface is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished. The polishing of the substrate takes place by the surface being placed in contact with the polishing pad and the polishing composition of the invention and then the polishing pad moving relative to the surface (with the polishing composition therebetween), so as to abrade at least a portion of the surface to polish the surface.

Advantageously, when the polishing pad comprises a polymeric polishing film releasably associated with a resilient subpad, the polymeric polishing film can be easily and economically replaced during or after use. During use, the polishing surface experiences degradation due to the action of the abrasive polishing slurry which can result in degradation of polishing performance. Polishing surfaces can be renewed by conditioning, for example by contacting the polishing surface with a fixed abrasive conditioning tool to remove at least a portion of the polishing surface and to thereby produce a fresh polishing surface. Alternatively, removing a first polymeric polishing film from the resilient subpad and associating a second polymeric polishing film with the resilient subpad forms a polishing pad having a new polishing surface. The second polymeric polishing film can be the same as the first polymeric polishing film, or it can be different. In some embodiments, the polymeric polishing film can be replaced during the polishing of a single substrate, wherein the first and second polymeric polishing films have a different composition or surface roughness and have different polishing characteristics.

The inventive method is particularly well-suited for the production of mirror surfaces on substrates comprising aluminum. In this regard, the inventive polishing method is capable of polishing lapped aluminum surfaces having an initial root mean square (RMS) surface roughness of greater than 600 nm to provide aluminum surfaces having RMS surface roughness of less than about 10 nm in less than 1 hour of polishing time. By way of contrast, single-point diamond turning of aluminum surfaces requires many hours to produce surfaces having comparable surface roughness.

Finally, the inventive method is well-suited to production of polished aluminum surfaces having any intermediate surface simply by controlling the duration of polishing. In particular, production of aluminum mirror surfaces for use in solar cell assemblies can be rapidly and economically achieved.

The following example further illustrates the invention but, of course, should not be construed as in any way limiting its scope.

Example

This example demonstrates the surface roughness achievable by the inventive method in the polishing of a commercially available aluminum having a lapped surface.

An 8 inch (20.3 cm) wafer consisting of 6061 T6 aluminum alloy and having a surface lapped to a matte finish was subjected to a two-step polishing process. The first polishing step comprised polishing with a polishing composition comprising 6 wt. % fumed silica and 1 wt. % ammonium persulfate in water, and having a pH of 9. The wafer was polished for 60 minutes with a downforce pressure of 27.6 kPa (4 psi) and then for 15 minutes with a downforce pressure of 20.7 kPa (3 psi), wherein the downforce pressure refers to the pressure of the substrate against the polishing pad, using a commercially available polishing apparatus equipped with a hard polyurethane polishing pad. After polishing, each wafer was buffed during a second polishing step for 1 minute with a slurry comprising 5 wt. % fumed silica and 0.03 wt. % of DeIonic LF-60MOD surfactant (from DeForest Enterprises, Boca Raton, Fla.) in water using a Politex pad at a downforce pressure of 13.8 kPa (2 psi). The polishing parameters were 50 rpm platen speed and 50 rpm carrier speed for all steps.

Following polishing, the total amount of surface material removed was determined, and the wafer was examined by atomic force microscopy (AFM) at 3 different regions to determine average surface roughness. The results are set forth in the Table.

TABLE

Removal rate and surface roughness of polished 6061 T6 aluminum alloy

| Total surface removed (Å) | Average surface roughness $R_a$ (nm) |
|---|---|
| 168, 178 | 1.58 (standard deviation = 0.23) |

The results of this example demonstrate that the inventive method produces an aluminum surface having an average surface roughness comparable to that achievable by single-point diamond turning.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of polishing a surface of a substrate comprising aluminum, which method comprises:
    (i) providing a substrate comprising aluminum,
    (ii) providing a polishing pad,
    (iii) providing a polishing composition comprising:
        (a) an abrasive selected from the group consisting of silica, ceria, and zirconia,
        (b) an agent that oxidizes aluminum, and
        (c) a liquid carrier, wherein the abrasive is in particulate form and is suspended in the liquid carrier,
    (iv) contacting a surface of the substrate with the polishing pad and the polishing composition, and
    (v) abrading at least a portion of the surface of the substrate to remove at least some aluminum from the substrate and to polish the surface of the substrate, wherein polishing the surface of the substrate results in an aluminum mirror surface having a root mean square surface roughness of less than about 10 nm.

2. The method of claim 1, wherein the substrate consists of aluminum.

3. The method of claim 1, wherein the substrate consists of an aluminum alloy.

4. The method of claim 3, wherein the aluminum alloy is a 6000 series aluminum alloy.

5. The method of claim 4, wherein the aluminum alloy is 6061 T6 aluminum alloy.

6. The method of claim 1, wherein the polishing pad consists of a polymer resin selected from the group consisting of thermoplastic elastomers, thermoplastic polyurethanes, thermoplastic polyolefins, polycarbonates, polyvinylalcohols, nylons, elastomeric rubbers, elastomeric polyethylenes, polytetrafluoroethylene, polyethyleneteraphthalate, polyimides, polyaramides, polyarylenes, polystyrenes, polymethylmethacrylates, copolymers thereof, and mixtures thereof.

7. The method of claim 6, wherein the polishing pad consists of thermoplastic polyurethane.

8. The method of claim 1, wherein the abrasive is fumed silica, precipitated silica, or condensation-polymerized silica.

9. The method of claim 8, wherein the agent that oxidizes aluminum is selected from the group consisting of ammonium persulfate, hydrogen peroxide, potassium hydrogen peroxymonosulfate sulfate, and peracetic acid.

10. The method of claim 9, wherein the polishing composition further comprises an organic acid.

11. The method of claim 1, wherein the abrasive is present in the polishing composition in the amount of about 0.1 wt. % to about 20 wt. % based on the total weight of the polishing composition.

12. The method of claim 11, wherein the abrasive is present in the polishing composition in the amount of about 1 wt. % to about 10 wt. % based on the total weight of the polishing composition.

13. The method of claim 1, wherein the agent that oxidizes aluminum is selected from the group consisting of ammonium persulfate, hydrogen peroxide, potassium hydrogen peroxymonosulfate sulfate, and peracetic acid.

14. The method of claim 1, wherein the polishing composition further comprises an organic acid.

15. The method of claim 14, wherein the organic acid is succinic acid.

16. The method of claim 1, further comprising the step of pre-polishing the aluminum surface prior to contacting the surface of the substrate with the polishing pad and the polishing composition.

17. The method of claim 16, wherein the step of pre-polishing the surface of the substrate is achieved by diamond turning of the surface.

18. The method of claim 16, wherein the step of pre-polishing the surface of the substrate is achieved by lapping.

19. The method of claim 1, wherein the surface is polished to provide a polished surface having a predetermined surface roughness.

20. The method of claim 1, wherein the surface is substantially planar.

21. A method of polishing a surface of a substrate comprising aluminum, which method comprises:
  (i) providing a substrate comprising aluminum,
  (ii) providing a polishing pad comprising (A) a resilient subpad and (B) a polymeric polishing film substantially coextensive with the resilient subpad, wherein the polymeric polishing film comprises a polishing surface and a back surface releasably associated with the resilient subpad,
  (iii) providing a polishing composition comprising:
    (a) an abrasive selected from the group consisting of silica, ceria, and zirconia,
    (b) an agent that oxidizes aluminum, and
    (c) a liquid carrier, wherein the abrasive is in particulate form and is suspended in the liquid carrier,
  (iv) contacting a surface of the substrate with the polishing surface of the polishing pad and the polishing composition, and
  (v) abrading at least a portion of the surface of the substrate to remove at least some aluminum from the substrate and to polish the surface of the substrate, wherein polishing the surface of the substrate results in an aluminum mirror surface having a root mean square surface roughness of less than about 10 nm.

22. The method of claim 21, wherein the substrate consists of aluminum.

23. The method of claim 21, wherein the substrate consists of an aluminum alloy.

24. The method of claim 23, wherein the aluminum alloy is a 6000 series aluminum alloy.

25. The method of claim 24, wherein the aluminum alloy is 6061 T6 aluminum alloy.

26. The method of claim 21, wherein the resilient subpad consists of thermoplastic polyurethane.

27. The method of claim 21, wherein the polymeric polishing film comprises a material selected from the group consisting of polycarbonate, polyester, nylon, polyvinyl chloride, and combinations thereof.

28. The method of claim 21, wherein the abrasive is fumed silica, precipitated silica, or condensation-polymerized silica.

29. The method of claim 28, wherein the agent that oxidizes aluminum is selected from the group consisting of ammonium persulfate, hydrogen peroxide, potassium hydrogen peroxymonosulfate sulfate, and peracetic acid.

30. The method of claim 29, wherein the polishing composition further comprises an organic acid.

31. The method of claim 21, wherein the abrasive is present in the polishing composition in the amount of about 0.1 wt. % to about 20 wt. % based on the total weight of the polishing composition.

32. The method of claim 31, wherein the abrasive is present in the polishing composition in the amount of about 1 wt. % to about 10 wt. % based on the total weight of the polishing composition.

33. The method of claim 21, wherein the agent that oxidizes aluminum is selected from the group consisting of ammonium persulfate, hydrogen peroxide, potassium hydrogen peroxymonosulfate sulfate, and peracetic acid.

34. The method of claim 21, wherein the polishing composition further comprises an organic acid.

35. The method of claim 34, wherein the organic acid is succinic acid.

36. The method of claim 21, further comprising the step of pre-polishing the aluminum surface prior to contacting the surface of the substrate with the polishing pad and the polishing composition.

37. The method of claim 36, wherein the step of pre-polishing the surface of the substrate is achieved by diamond turning of the surface.

38. The method of claim 36, wherein the step of pre-polishing the surface of the substrate is achieved by lapping.

39. The method of claim 21, wherein the surface is polished to provide a polished surface having a predetermined surface roughness.

40. The method of claim 21, wherein the surface is substantially planar.

41. The method of claim 21, wherein the surface is concave.

42. The method of claim 21, wherein the surface is convex.

* * * * *